(12) United States Patent
Kang et al.

(10) Patent No.: US 8,026,590 B2
(45) Date of Patent: Sep. 27, 2011

(54) DIE PACKAGE AND METHOD OF MANUFACTURING THE SAME

(75) Inventors: Joon Seok Kang, Gyunggi-do (KR);
Young Ho Kim, Seoul (KR); Young Do Kweon, Seoul (KR); Jin Gu Kim, Gyunggi-do (KR); Sung Yi, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 121 days.

(21) Appl. No.: 12/581,131

(22) Filed: Oct. 17, 2009

(65) Prior Publication Data
US 2011/0042799 A1    Feb. 24, 2011

(30) Foreign Application Priority Data
Aug. 19, 2009  (KR) .................. 10-2009-0076744

(51) Int. Cl.
  *H01L 23/488*  (2006.01)
  *H01L 21/58*  (2006.01)
(52) U.S. Cl. ............... 257/690; 257/692; 257/E21.499; 257/E23.023; 438/106; 438/119; 438/124
(58) Field of Classification Search ............ 257/690, 257/692, 693, 779, E23.023, E21.499, E21.502; 438/106, 111, 118, 119, 121
See application file for complete search history.

(56) References Cited

U.S. PATENT DOCUMENTS

| | | | |
|---|---|---|---|
| 6,867,471 B2 * | 3/2005 | Goller et al. | 257/501 |
| 7,396,700 B2 * | 7/2008 | Hsu | 438/107 |
| 7,675,157 B2 * | 3/2010 | Liu et al. | 257/690 |
| 7,841,076 B2 * | 11/2010 | Fujii | 29/832 |
| 2009/0294961 A1 * | 12/2009 | Meyer et al. | 257/738 |

FOREIGN PATENT DOCUMENTS

| | | |
|---|---|---|
| JP | 2005-150385 | 6/2005 |
| KR | 1020080004919 | 1/2008 |
| KR | 1020080055687 | 6/2008 |

OTHER PUBLICATIONS

Office Action from counterpart Korean Patent Application No. 10-2009-0076744, Feb. 17, 2011, 4 pages.

* cited by examiner

*Primary Examiner* — Tuan N. Quach
(74) *Attorney, Agent, or Firm* — Blakely, Sokoloff, Taylor & Zafman, LLP

(57) ABSTRACT

Disclosed herein are a die package and a method of manufacturing the die package. A solder layer is formed on a lower surface of a die. The die is self-aligned and attached to a support plate using surface tension between the solder layer and a metal layer of the support plate, thus reducing attachment lead time of the die.

16 Claims, 11 Drawing Sheets

DIE PACKAGE AND METHOD OF MANUFACTURING THE SAME

CROSS REFERENCE TO RELATED APPLICATION

This application claims the benefit of Korean Patent Application No. 10-2009-0076744, filed Aug. 19, 2009, entitled "DIE PACKAGE AND FABRICATING METHOD OF THE SAME", which is hereby incorporated by reference in its entirety into this application.

BACKGROUND OF THE INVENTION

1. Technical Field

The present invention relates to a die package and a method of manufacturing the die package.

2. Description of the Related Art

Recently, the electronics industry trend is to provide products which have light, thin, short and small structures, multifunctions and high performance and can be produced at low costs. Packaging technology is one of the technologies which realizes the above-mentioned goals. Particularly, a lot of research into an SIP (system in packaging) technology based on a PCB (printed circuit board) has been actively conducted because it is a packaging technology which enhances mounting efficiency.

The SIP technology includes an SMT (surface mounting technology) which mounts dies to the surface of a PCB, and an EAD (embedded active die) technology which embeds dies in a PCB. These technologies are conducted using die attachment apparatuses.

FIG. 1 is a view illustrating a method of mounting a die to a PCB using a die attachment apparatus, according to a conventional technique. Hereinafter, the die attachment apparatus and a die attachment method using the same according to the conventional technique will be explained with reference to FIG. 1.

As shown in FIG. 1, the die attachment apparatus 10 according to the conventional technique includes a die loading unit 20, a slide glass 30, visual cameras 30a and 30b and a die bonding unit 40.

The die loading unit 20 picks up each die D that has been diced from a wafer W and moves it on the slide glass 30. The die loading unit 20 includes a pickup head 22 for to loading. Here, pads P are formed on the upper surface of the die D. A die attach film (DAF) is attached to the lower surface of the die D.

The slide glass 30 allows the positions of the corners of the die D and the positions of the pads P to be recognized using the visual cameras 30a and 30b. To achieve this purpose, the slide glass 30 is made of transparent material. That is, the die D is placed on the transparent slide glass 30, so that the positions of the corners of the die D and the positions of the pads P can be determined by the visual cameras 30a and 30b.

The visual cameras 30a and 30b function to recognize the positions of the corners of the die D and the positions of the pads P in an image recognition manner. The visual cameras 30a and 30b include an upper visual camera 30a which is disposed above the slide glass 30, and a lower visual camera 30b which is disposed below the slide glass 30.

The die bonding unit 40 includes a pickup head 42 which picks up the die D and attaches the die D to a board 50. The die bonding unit 40 attaches the die D to the board 50 using the positions of the corners of the die D and the positions of the pads P which are measured by the visual cameras 30a and 30b.

However, to attach the die D to the board 50 using the die attachment apparatus according to the conventional technique, the slide glass 30 and an image recognition process using the slide glass 30 are absolutely necessary. In particular, because the process of dicing each die from the wafer W causes a dicing error, not only the positions of the corners of the die D but also the positions of the pads on the die D must be precisely measured to reduce an error in alignment. Thus, the slide glass 30 is also essential to measure both the upper surface and the lower surface of the die D using the visual cameras 30a and 30b.

In such an image recognition process using the slide glass 30, the die D is loaded and placed on the slide glass 30. Thereafter, the visual cameras 30a and 30b recognize the positions of the corners of the die D and the positions of the pads. The die bonding unit 40 subsequently picks up the die D and mounts it to the board 50. As such, the process is complex, so that processing time is increased.

Furthermore, because the die D is stuck on the slide glass 30 by the DAF attached to the lower surface of the die D, when the pickup head 42 of the die bonding unit 40 picks up the die D from off the slide glass 30, the die D may not smoothly detach itself from the slide glass 30.

In addition, when the lower visual camera 30b recognizes the positions of the corners of the die D through the slide glass 30, the recognition rate of the positions of the corners of the die D may be markedly impaired because of deterioration of the reflection rate of the DAF.

As well, the conventional die attachment apparatus is problematic in that it is expensive, the lead time per unit process is relatively long, and costs per unit process are high.

SUMMARY OF THE INVENTION

The present invention has been made in an effort to provide a die package and a method of manufacturing the die package in which a die is attached to a support plate using a technique of self-aligning the die, thus ensuring high precision without using a separate die attachment apparatus which is expensive.

In a die package according to an embodiment of the present invention, a support plate is made of metal and has a die attachment area on an upper surface thereof. An alignment assisting insulation layer is formed on the upper surface of the support plate. The alignment assisting insulation layer is open on the die attachment area of the support plate. A die has a solder layer formed on a lower surface thereof, and a pad formed on an upper surface thereof. The die is mounted to the die attachment area of the support plate through the solder layer. A metal post is formed on the pad of the die. An encapsulation layer is formed on the alignment assisting insulation layer and the die such that an upper surface of the metal post is exposed outside the encapsulation layer. A redistribution layer is connected at a first end thereof to the metal post. The redistribution layer extends a predetermined length on the encapsulation layer. A solder resist layer is formed on the encapsulation layer. The solder resist layer has an opening such that the second end of the redistribution layer is exposed outside through the opening of the solder resist layer.

The alignment assisting insulation layer may be thinner than the die.

Furthermore, a metal auxiliary layer may be formed on the lower surface of the die to facilitate the formation of the solder layer.

In addition, an external connection terminal may be formed on the second end of the redistribution layer which is exposed outside through the opening of the solder resist layer.

In a die package according to another embodiment of the present invention, a support plate has a die attachment area thereon. An alignment guide metal layer is formed on the die attachment area of the support plate. A die has a solder layer formed on a lower surface thereof, and a pad formed on an upper surface thereof. The die is mounted to the die attachment area of the support plate through the solder layer. A metal post is formed on the pad of the die. An encapsulation layer is formed on the support plate and the die such that an upper surface of the metal post is exposed outside the encapsulation layer. A redistribution layer is connected at a first end thereof to the metal post. The redistribution layer extends a predetermined length on the encapsulation layer. A solder resist layer is formed on the encapsulation layer. The solder resist layer has an opening such that the second end of the redistribution layer is exposed outside through the opening of the solder resist layer.

Furthermore, a metal auxiliary layer may be formed on the lower surface of the die to facilitate the formation of the solder layer.

In addition, an external connection terminal may be formed on the second end of the redistribution layer which is exposed outside through the opening of the solder resist layer.

In a method of manufacturing a die package according to an embodiment of the present invention, an alignment assisting insulation layer is formed on an upper surface of a support plate made of metal. The support plate has a die attachment area on an upper surface thereof. The alignment assisting insulation layer is open on the die attachment area of the support plate. A die having a solder layer on a lower surface thereof is mounted to the die attachment area of the support plate using surface tension between the solder layer and the support plate. A metal post is formed on a pad provided on an upper surface of the die. An encapsulation layer is formed such that an upper surface of the metal post is exposed outside the encapsulation layer. A redistribution layer is formed. The redistribution layer extends a predetermined length on the encapsulation layer such that a first end of the redistribution layer is connected to the metal post. A solder resist layer is formed on the encapsulation layer and the redistribution layer. The solder resist layer has an opening such that the second end of the redistribution layer is exposed outside through the opening of the solder resist layer.

At the forming of the alignment assisting insulation layer, the alignment assisting insulation layer may be formed thinner than the die.

Furthermore, a metal auxiliary layer may be formed on the lower surface of the die to facilitate the formation of the solder layer.

At the mounting of the die, the die having the solder layer on the lower surface thereof may be disposed around the die attachment area of the support plate using a pickup head. The die may be automatically aligned with the die attachment area using surface tension between the solder layer and the support plate in such a way as to apply heat to the solder layer.

After the forming of the solder resist layer, an external connection terminal is formed on the second end of the redistribution layer which is exposed outside through the opening of the solder resist layer. A package set including a plurality of die packages may be singulated into individual die packages along scribing lines, thus producing the die package.

In a method of manufacturing a die package according to another embodiment of the present invention, an alignment guide metal layer is formed on a die attachment area of a support plate. A die having a solder layer on a lower surface thereof is mounted to the die attachment area of the support plate using surface tension between the solder layer and the alignment guide metal layer. A metal post is formed on a pad provided on an upper surface of the die. An encapsulation layer is formed such that an upper surface of the metal post is exposed outside the encapsulation layer. A redistribution layer is formed. The redistribution layer extends a predetermined length on the encapsulation layer such that a first end of the redistribution layer is connected to the metal post. A solder resist layer is formed on the encapsulation layer and the redistribution layer. The solder resist layer has an opening such that the second end of the redistribution layer is exposed outside through the opening of the solder resist layer.

A metal auxiliary layer may be formed on the lower surface of the die to facilitate the formation of the solder layer.

At the mounting of the die, the die having the solder layer on the lower surface thereof may be disposed around the die attachment area of the support plate using a pickup head. The die may be automatically aligned with the die attachment area using surface tension between the solder layer and the alignment guide metal layer in such a way as to apply heat to the solder layer.

After the forming of the solder resist layer, an external connection terminal may be formed on the second end of the redistribution layer which is exposed outside through the opening of the solder resist layer. A package set including a plurality of die packages may be singulated into individual die packages along scribing lines, thus producing the die package.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
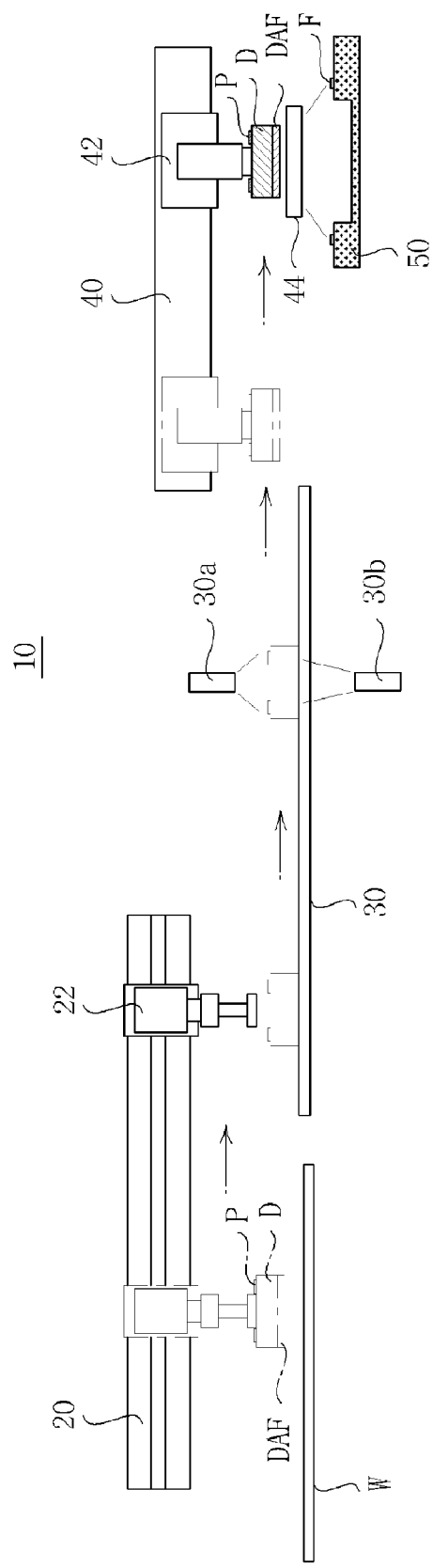
FIG. 1 is a view illustrating a method of mounting a die to a PCB using a die attachment apparatus, according to a conventional technique.

In the specification, the terms "first", "second", etc. are used only to distinguish to elements from each other, rather than for expressing quantity, order or degree of importance. Furthermore, reference should now be made to the drawings, in which the same reference numerals are used throughout the different drawings to designate the same or similar components. In the following description, when it is determined that the detailed description of the conventional function and conventional structure would confuse the gist of the present invention, such a description may be omitted.

Furthermore, the terms and words used in the specification and claims are not necessarily limited to typical or dictionary meanings, but must be understood to indicate concepts selected by the inventor as the best method of illustrating the present invention, and must be interpreted as having meanings and concepts adapted to the scope and sprit of the present invention for the purpose of understanding the technology of the present invention.

Hereinafter, embodiments of the present invention will be described in detail with reference to the attached drawings.

Structure of a Die Package

First Embodiment

Figure 2:
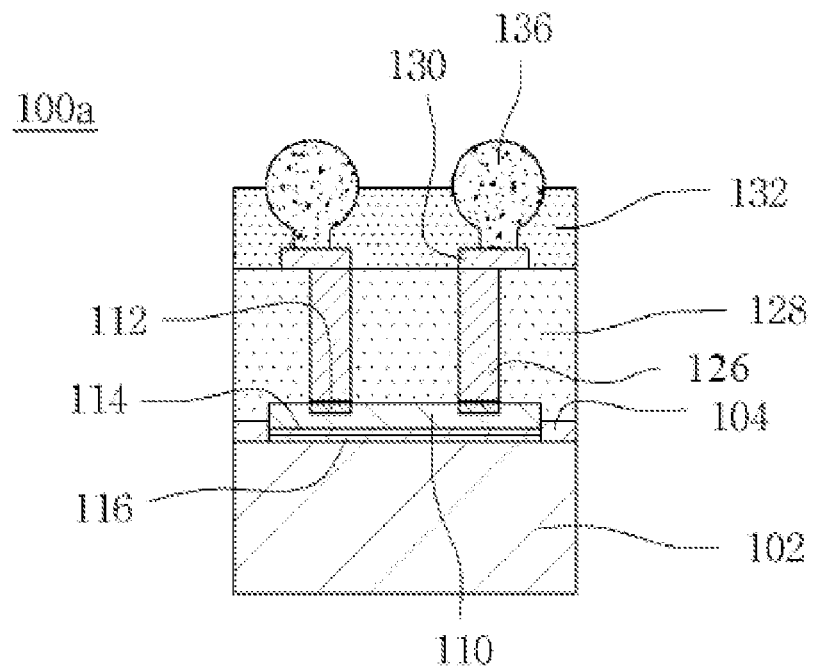
FIG. 2 is a sectional view of a die package, according to a first embodiment of the present invention.

FIG. 2 is a sectional view of a die package 100a, according to a first embodiment of the present invention. The die package 100a according to the first embodiment of the present invention will be described in detail with reference to FIG. 2.

As shown in FIG. 2, the die package 100a according to this embodiment includes a support plate 102, a die 110, metal posts 126, an encapsulation layer 128, redistribution layers 130 and a solder resist layer 132.

The support plate 102 supports the entire package including the die 110. In addition, the support plate 102 has a heat dissipation function and serves to assist self-alignment of the die 110. The support plate 102 is made of metal and has a die attachment area thereon. An alignment assisting insulation layer 104 is applied to the upper surface of to the support plate 102 and is open on the die attachment area of the die 110. Here, the alignment assisting insulation layer 104 is thinner than the die 110 to prevent it from disturbing, due to a difference in height, self alignment between the support plate 102 and a solder layer 116 formed under the lower surface of the die 110.

The die 110 has pads 112 on the upper surface thereof and the solder layer 116 on the lower surface thereof. The die 110 is mounted to the die attachment area of the support plate 102 in a face-up fashion. Here, surface tension between the support plate 102 and the solder layer 116 which is formed under the lower surface of the die 110 is greater than that between the alignment assisting insulation layer 104 and the solder layer 116. Hereby, the solder layer 116 can be mounted to the die attachment area in a self-alignment manner. Preferably, a metal auxiliary layer 114 is applied to the lower surface of the die 110 to facilitate the adhesion of the solder layer 116 to the die 110.

The metal posts 126 make fine pitch of a wiring pattern possible. As well, the metal posts 126 realize rapid signal transmission of the die 110 and function to maintain a separation distance between chips. As well, the metal posts 126 perform a function of heat dissipation. The metal posts 126 protrude from the pads 112 upwards. In the embodiment, each metal post 126 has a cylindrical structure and is made of material, such as copper (Cu), nickel (Ni), tin (Sn), gold (Au), etc.

The encapsulation layer 128 covers the die 110 and the metal posts 126 and, for example, is made of epoxy molding compound (EMC).

The redistribution layers 130 function to guide wiring from the metal posts 126 formed on the pads 112 to other positions. Each redistribution layer 130 is connected at a first end thereof to the corresponding metal post 126 and extends a predetermined length on the encapsulation layer 128. The redistribution layers 130 are made of conductive metal, such as aluminum (Al), copper (Cu), nickel (Ni), gold (Au), etc. Furthermore, an external connection terminal 136, such as a solder ball, which connects the die 110 to an external system, is formed on a second end of each redistribution layer 130.

The solder resist layer 132 is formed on the encapsulation layer 128 to cover and protect the upper surface of the metal posts 126 and the redistribution layers 130. Here, the solder resist layer 132 includes therein openings 134 through which the second ends of the redistribution layers 130 which function as connection pads are exposed to the outside.

Structure of a Die Package

Second Embodiment

Figure 3:
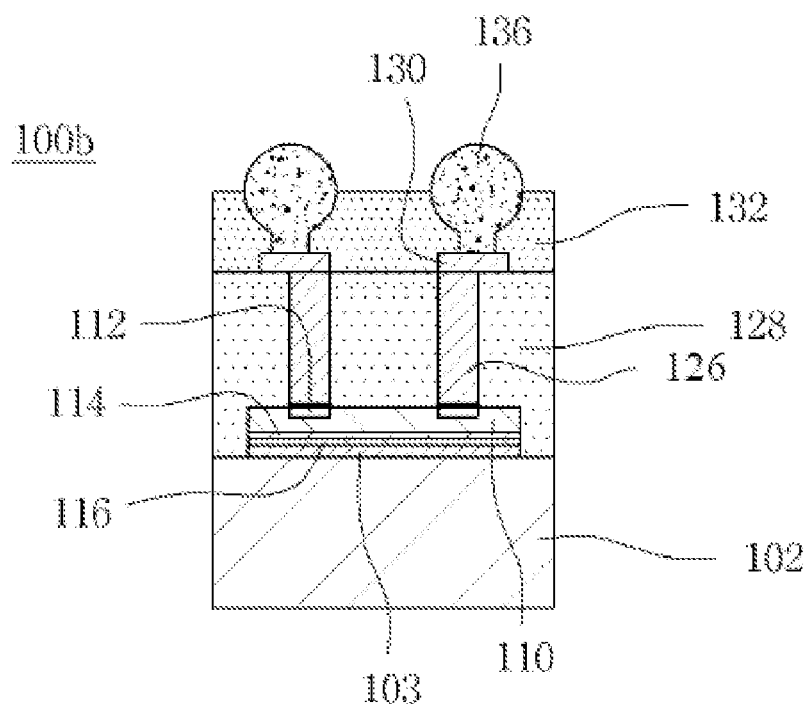
FIG. 3 is a sectional view of a die package, according to a second embodiment of the present invention.

FIG. 3 is a sectional view illustrating a die package 100b, according to a second embodiment of the present invention. The die package 100a according to the second embodiment of the present invention will be described in detail with reference to FIG. 2. In the description of the second embodiment, the same reference numerals will be used to designate the same or similar components as those of the first embodiment, and the repetition of the same description will be omitted.

As shown in FIG. 3, in the die package 100b according to the second embodiment, a die 110 which has a solder layer 116 on the lower surface thereof is mounted to a support plate 102 which is made of an insulating material. In the second embodiment, an alignment guide metal layer 103 is applied to a die attachment area of the support plate 102. Thus, the die 110 is mounted to the support plate 102 in a self-alignment manner using surface tension between the solder layer 116 and the alignment guide metal layer 103.

In other words, the second embodiment is characterized in that the self-alignment of the die 110 is realized by the fact that surface tension between the solder layer 116 and the alignment guide metal layer 103 is greater than that between the solder layer 116 and the support plate 102 made of insulating material. The general construction of the second embodiment other than the above-mentioned structure remains the same as that of the first embodiment, therefore further explanation is deemed unnecessary.

Method of Manufacturing a Die Package

First Embodiment

FIGS. 4 through 15 are sectional views illustrating, in the order of processing, a method of manufacturing the die package 100a according to the first embodiment of the present invention. Hereinafter, the method of manufacturing the die package 100a of FIG. 2 will be described in detail with reference to these drawings.

Figure 4:
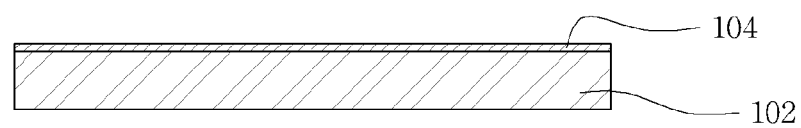
FIGS. 4 through 15 are sectional views illustrating, in the order of processing, a method of manufacturing the die package according to the first embodiment of the present invention.

First, as shown in FIG. 4, the alignment assisting insulation layer 104 is formed on one surface of the support plate 102.

In this embodiment, the support plate 102 guides self-alignment of the die 110 using its surface tension with the solder layer 116 and conducts the function of supporting the die 110 and a heat dissipation function during the process of manufacturing the die package 100a. The support plate 102 is made of metal having appropriate strength and superior heat dissipation ability, for example, of copper (Cu), aluminum (Al), etc.

The alignment assisting insulation layer 104 which is formed on the surface of the support plate 102 has low surface tension with respect to the solder layer 116, thus assisting the alignment of the die. Here, it is sufficient if the alignment assisting insulation layer 104 provides a difference in surface tension to assist the alignment of the die 110. Therefore, it is preferable that the alignment assisting insulation layer 104 have a thin structure to reduce the cost of materials and the entire thickness of the die package, for example, it be formed in a film shape which is thinner than the die 110.

Figure 5:
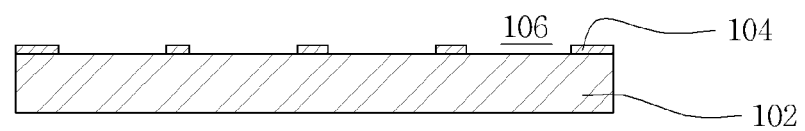

Thereafter, as shown in FIG. 5, first openings 106 are formed through the alignment assisting insulation layer 104 to open the die attachment areas of the support plate 102.

Here, each first opening 106 has a size corresponding to the relative die attachment area. For example, a photo resist which has had holes formed at portions corresponding to the die attachment areas through exposure and development processes is applied to the alignment assisting insulation layer 104. Subsequently, portions of the alignment assisting insulation layer 104 which are exposed through the holes of the photo resist are removed. Thereafter, the remaining photo resist is stripped, thus forming the first openings 106 in the alignment assisting insulation layer 104.

Figure 6:
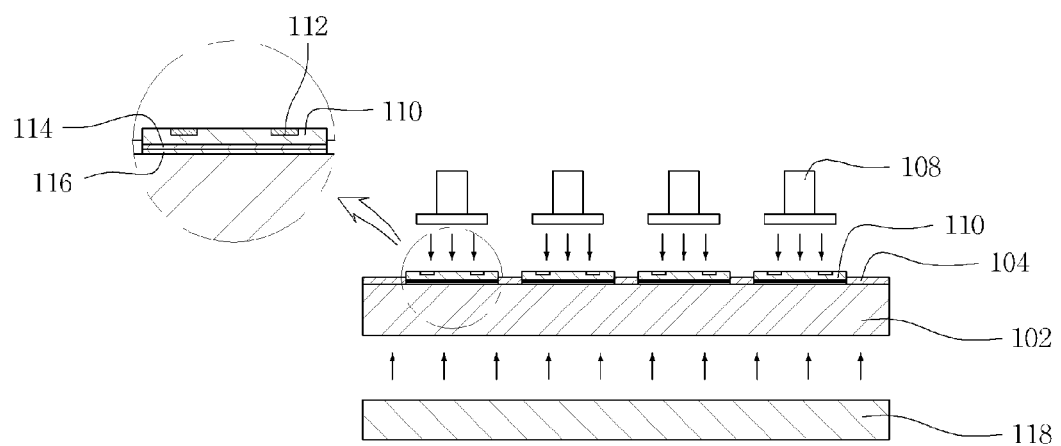

Next, as shown in FIG. 6, the dies 110 are mounted to portions of the support plate 102 which are exposed through the first openings 106.

Here, the die 110 has on the upper surface thereof the pads 112 which are electrically connected to an integrated circuit (not shown) formed on an upper surface of a chip body made of silicone. The solder layer 116 is applied to the lower surface of the die 110. In the embodiment, the metal auxiliary layer 114 is formed on the lower surface of the metal die 110 to facilitate the application of the solder layer 116.

At this step, the pickup heads 108 pick the dies 110 up in a face-up fashion and move the dies 110 around the corresponding first openings 106 of the alignment assisting insulation layer 104. Then, each die 110 is automatically aligned with the corresponding first opening 106 by surface tension generated between the solder layer 116 and the support plate 102 and then inserted into the first opening 106, thus reducing the time taken to mount the dies 110 on the support plate 102. In other words, the present invention proposes a self-alignment technique using a difference in surface tension with respect to the solder layer 116 between the support plate 102 and the alignment assisting insulation layer 104, thus increasing the precision in aligning the die 110, and reducing lead time of die attachment.

Furthermore, at this step, surface tension between the solder layers 116 and the support plate 102 can be reliably used in such a way that a heater 118 applies heat at a predetermined temperature to the solder layers 116 which have been hardened on the lower surfaces of the dies 110.

Figure 7:
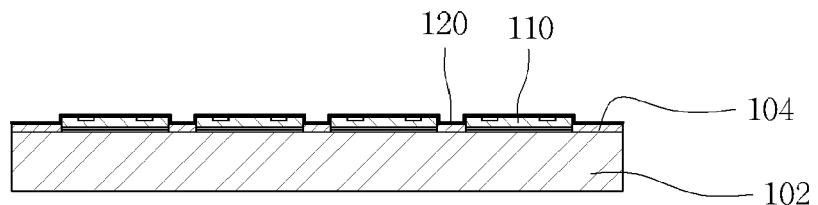

Next, as shown in FIG. 7, a seed layer 120 is formed on the alignment assisting insulation layer 104 and the dies 110 by electroless plating.

The seed layer 120 is formed, for example, by a typical catalytic deposition method including a cleaner process, a soft etching process, a pre-catalyst treatment, catalyst treatment, an accelerator process, an electroless copper plating process and an antioxidizing treatment. The catalytic deposition method is a well known technique, thus further explanation will be omitted.

Figure 8:
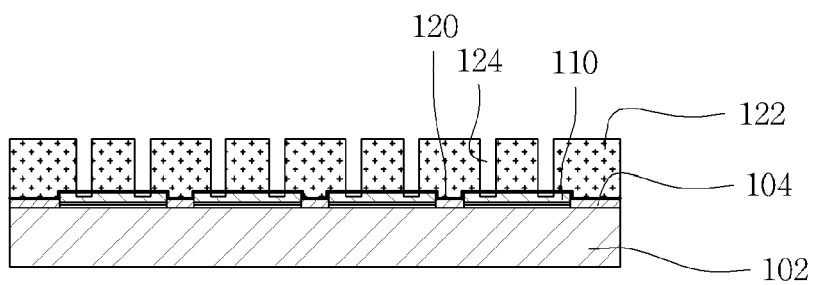

Thereafter, as shown in FIG. 8, a plating resist 122 is formed on the seed layer 120. The plating resist 122 has openings 124 through which the pads 112 of the dies 110 are exposed outside.

Figure 9:
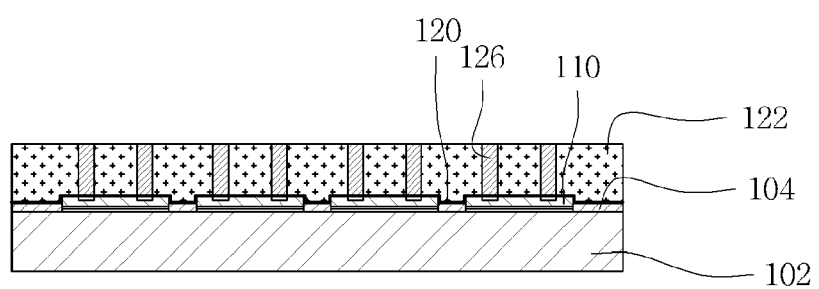

Next, as shown in FIG. 9, the metal posts 126 which are connected to the pads 112 of the dies 110 are formed in the openings 124 of the seed layer 120 by electrolytic copper plating.

Figure 10:
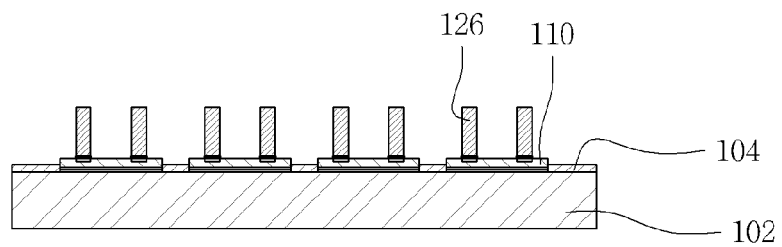

Subsequently, as shown in FIG. 10, the plating resist 122 is removed, and the seed layer 120 which is exposed to the outside is also removed. Here, the seed layer 120 can be removed by a method, such as flash etching, quick etching, etc.

Figure 11:
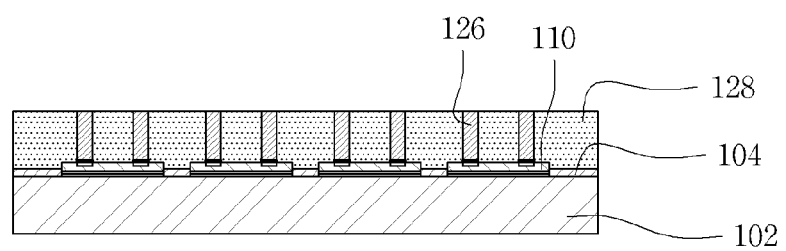

Thereafter, as shown in FIG. 11, the encapsulation layer 128 is formed on the dies 110 and the alignment assisting insulation layer 104.

The encapsulation layer 128 functions to protect the dies 110 and the metal posts 126 from the outside and is formed, for example, by printing, molding or spin coating using epoxy molding compound.

Figure 12:
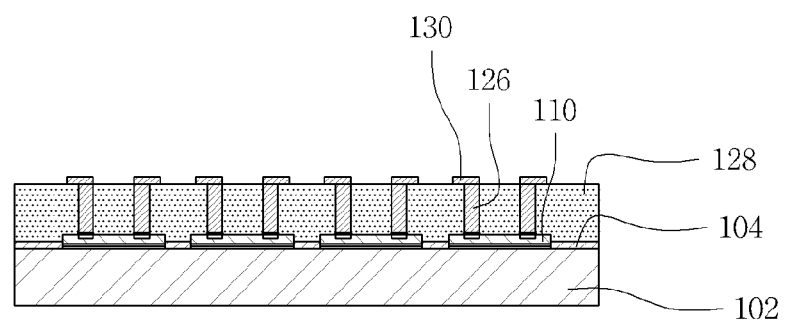

Subsequently, as shown in FIG. 12, the redistribution layers 130 which are connected at first ends thereof to the corresponding metal posts 126 extend predetermined lengths on the encapsulation layer 128. Here, a separate connection pad may be formed on a second end of each redistribution layer 130.

Figure 13:
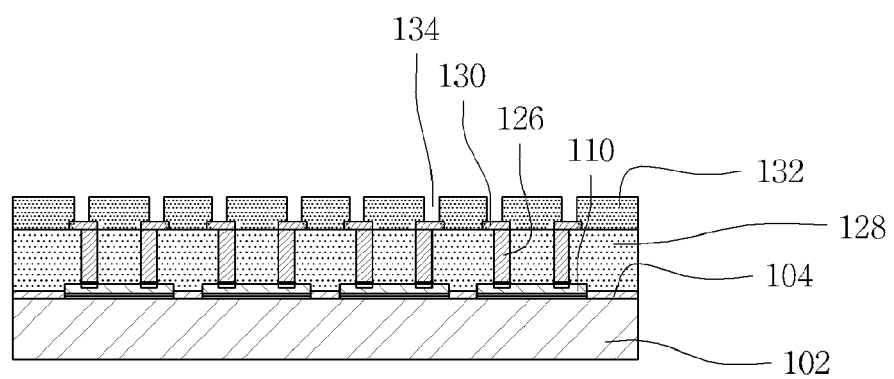

Thereafter, as shown in FIG. 13, the solder resist layer 132 is formed on the encapsulation layer 128. The second openings 134 through which the second ends of the to redistribution layers 130 are exposed outside are formed through the solder resist layer 132.

Figure 14:
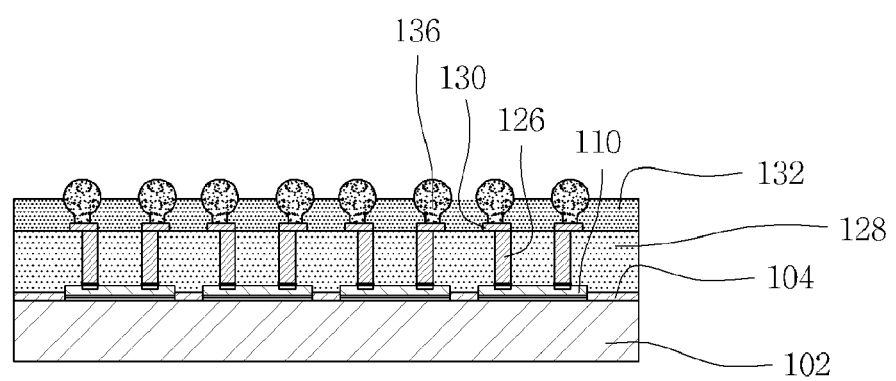

As shown in FIG. 14, the external connection terminals 136, such as solder balls, are thereafter formed on the second ends of the redistribution layers 130 which are exposed through the second openings 134 of the solder resist layer 132.

Figure 15:
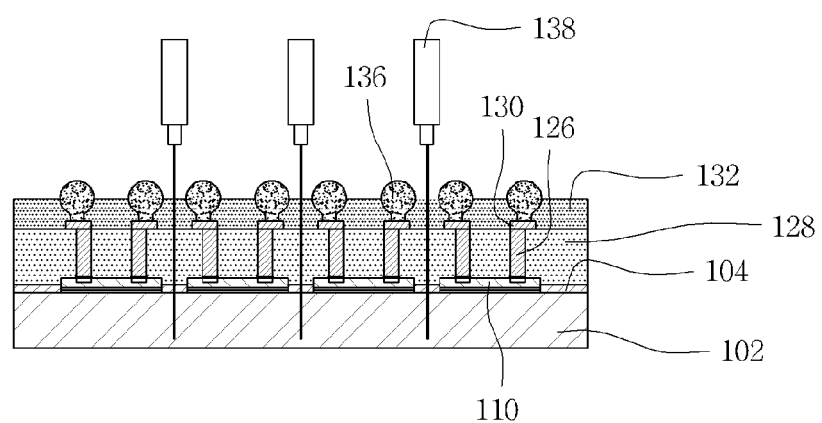

Finally, as shown in FIG. 15, a singulation process is conducted along scribing lines by a dicing apparatus 130, so that the product is diced into individual dies packages.

As a result, the die packages 100a illustrated in FIG. 2 are produced through the above-stated manufacturing process.

Method of Manufacturing a Die Package

Second Embodiment

FIGS. 16 through 28 are sectional views illustrating, in the order of processing, a method of manufacturing the die package 100b according to the second embodiment of the present invention. In the description of the manufacturing method according to the second embodiment, the same reference numerals will be used to designate the same or similar components as those of the first embodiment, and the repetition of the same description will be omitted. Hereinafter, the method of manufacturing the die package 100b of FIG. 3 will be described in detail with reference to these drawings.

Figure 16:
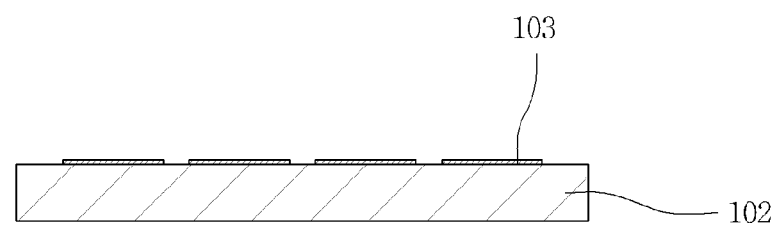
FIGS. 16 through 26 are sectional views illustrating, in the order of processing, a method of manufacturing the die package according to the second embodiment of the present invention.

As shown in FIG. 16, the alignment guide metal layers 103 are formed on die attachment areas of the support plate 102. That is, this embodiment is characterized in that the support plate 102 is made of insulation material and the alignment guide metal layers 103 are formed on the support plate 102. Here, it is preferable that the alignment guide metal layers 103 be relatively thin to reduce a difference in height between the metal layers 103 and portions other than the metal layers 103. The reason for this is that the self-alignment of the dies 110 must be prevented from being disturbed by a difference in height therebetween.

Figure 17:
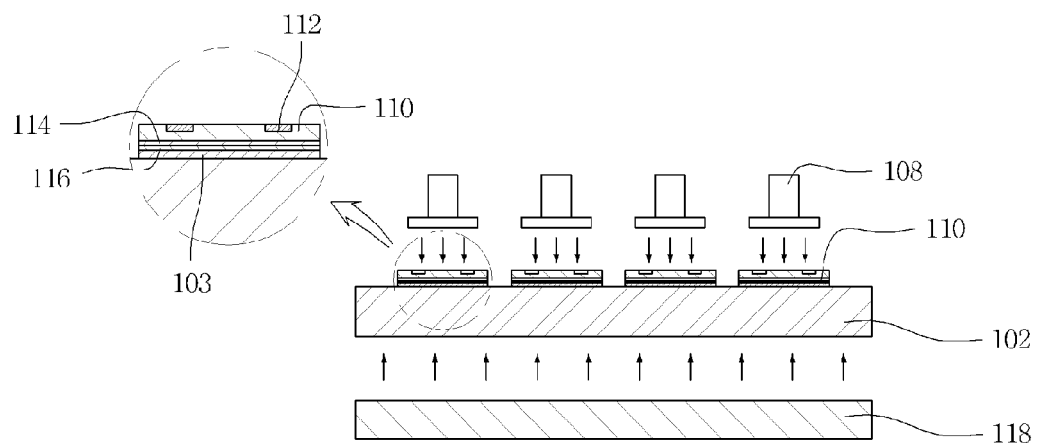

Thereafter, as shown in FIG. 17, the dies 110 are respectively mounted to the alignment guide metal layers 103. At this step, the pickup heads 108 pick the dies 110 up in a face-up fashion and move the dies 110 around the corresponding alignment guide metal layers 103. Then, each die 110 is automatically aligned with the corresponding alignment guide metal layer 103 by surface tension generated between the solder layer 116 and the alignment guide metal layer 103 and then attached to the alignment guide metal layer 103, thus reducing the time taken to mount the dies 110 to the support plate 102. In other words, the present invention proposes a self-alignment technique using a difference in surface tension with respect to the solder layer 116 between the support plate 102 and the alignment guide metal layer 103, thus increasing precision of aligning the die 110, and reducing lead time of die attachment.

Figure 18:
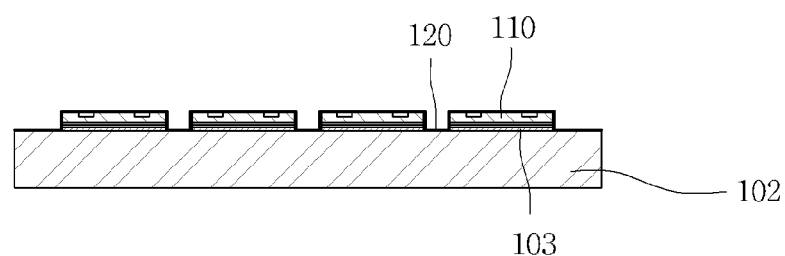

Subsequently, as shown in FIG. 18, a seed layer 120 is formed on the support plate 102 and the dies 110 by electroless plating.

Figure 19:
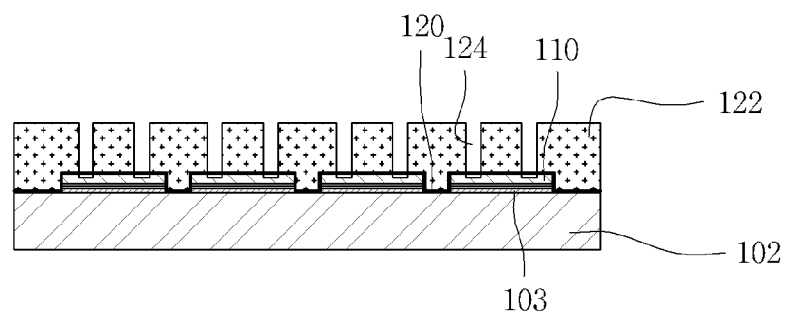

Next, as shown in FIG. 19, a plating resist 122 is formed on the seed layer 120. The plating resist 122 has openings 124 through which the pads 112 of the dies 110 are exposed outside.

Figure 20:
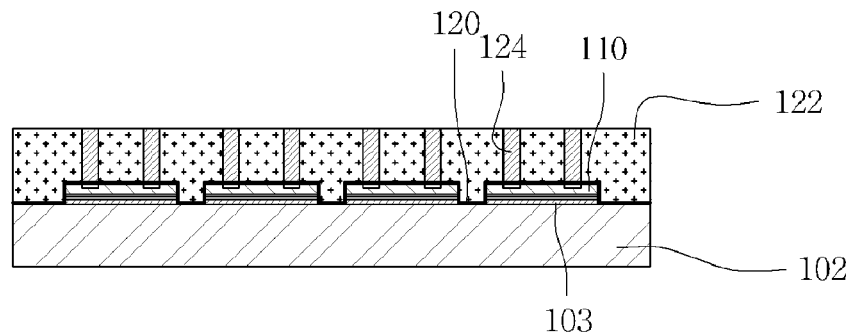

As shown in FIG. 20, the metal posts 126 which are connected to the pads 112 of the dies 110 are formed in the openings 124 of the seed layer 120 by electrolytic copper plating.

Figure 21:
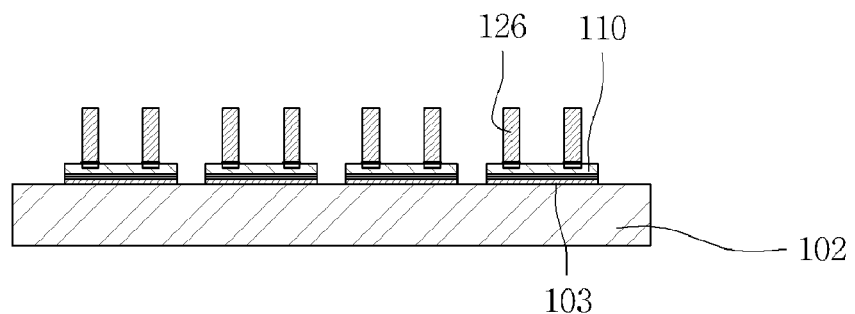
Figure 22:
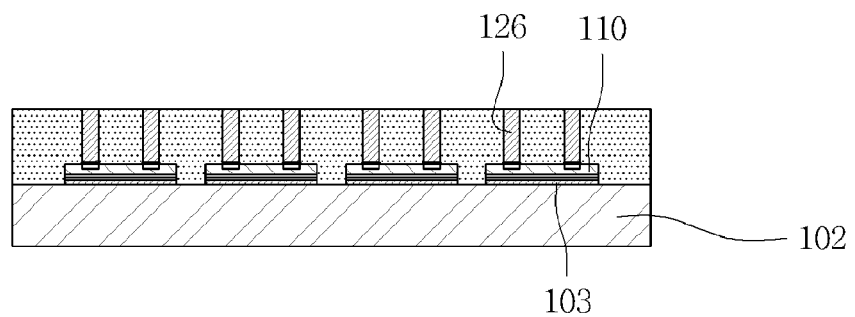

As shown in FIG. 21, the plating resist 122 is thereafter removed, and the seed layer 120 which is exposed to the outside is also removed. Thereafter, as shown in FIG. 22, the encapsulation layer 128 is formed on the dies 110 and the support plate 102.

Figure 23:
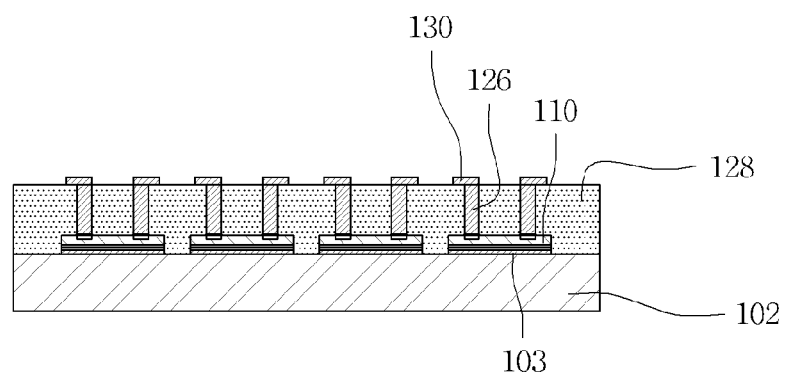

As shown in FIG. 23, the redistribution layers 130 which are connected at first ends thereof to the corresponding metal posts 126 extend predetermined lengths on the encapsulation layer 128.

Figure 24:
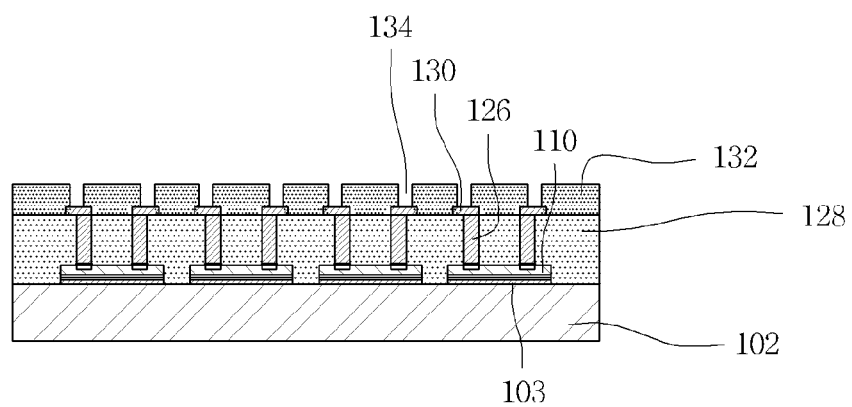

Subsequently, as shown in FIG. 24, the solder resist layer 132 is formed on the encapsulation layer 128. The second openings 134 through which second ends of the redistribution layers 130 are exposed outside are formed through the solder resist layer 132.

Figure 25:
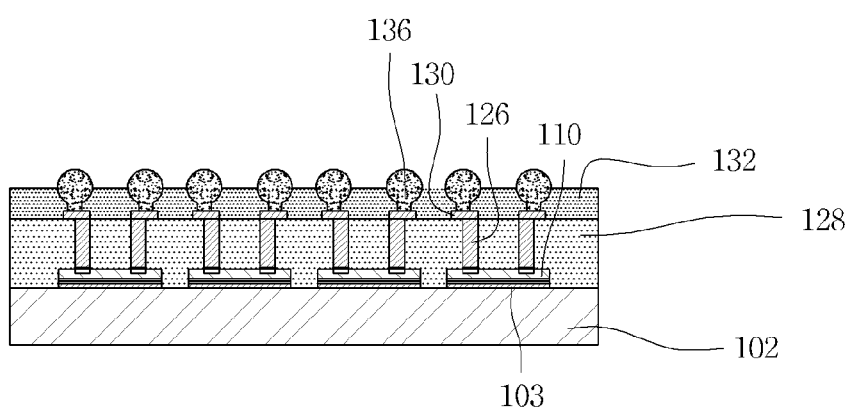

As shown in FIG. 25, the external connection terminals 136, such as solder balls, are thereafter formed on the second ends of the redistribution layers 130 which are exposed through the second openings 134 of the solder resist layer 132.

Figure 26:
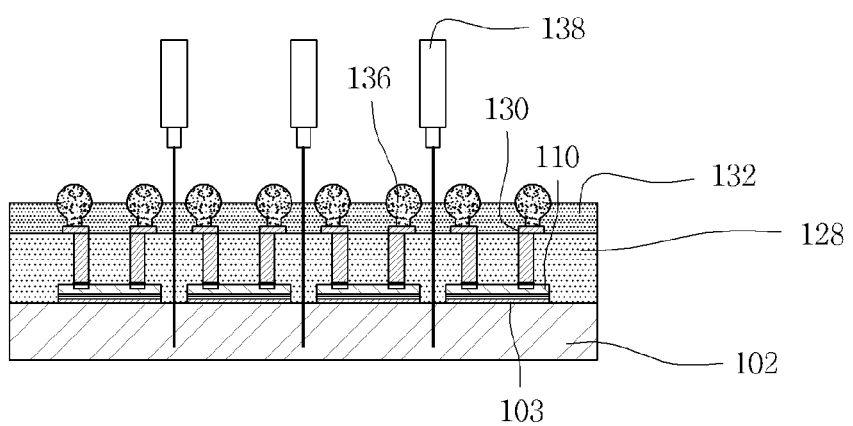

Finally, as shown in FIG. 26, a singulation process is conducted along scribing lines by a dicing apparatus 130, so that the product is diced into individual packages.

As a result, the die packages 100b illustrated in FIG. 3 are produced through the above-stated manufacturing process.

As described above, in the present invention, a die is mounted to a support plate using surface tension between a solder layer formed on the lower surface of the die and a support plate made of metal or between the solder layer and an alignment guide metal layer, thus reducing lead time of die attachment.

Furthermore, in the present invention, an alignment assisting insulation layer may be formed on a portion of the support plate other than die attachment areas. The alignment assisting insulation layer forms relatively low surface tension between it and the solder layer, so that the effect of the surface tension between the solder layer and the support plate can be further increased.

In addition, the support plate to which the die is mounted has high heat dissipation efficiency. Therefore, the heat dissipation ability of the die package can be markedly enhanced.

Although the embodiments of the present invention have been disclosed for illustrative purposes, it will be appreciated that a die package and a method of manufacturing the die package according to the invention are not limited thereby, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A die package, comprising:
   a support plate made of metal, the support plate having a die attachment area on an upper surface thereof, with an alignment assisting insulation layer formed on the upper surface of the support plate, the alignment assisting insulation layer being open on the die attachment area of the support plate;
   a die having a solder layer formed on a lower surface thereof, and a pad formed on an upper surface thereof, the die being mounted to the die attachment area of the support plate through the solder layer;
   a metal post formed on the pad of the die;
   an encapsulation layer formed on the alignment assisting insulation layer and the die such that an upper surface of the metal post is exposed outside the encapsulation layer;
   a redistribution layer connected at a first end thereof to the metal post, the redistribution layer extending a predetermined length on the encapsulation layer; and
   a solder resist layer formed on the encapsulation layer, the solder resist layer having an opening such that the second end of the redistribution layer is exposed outside through the opening of the solder resist layer.

2. The die package as set forth in claim 1, wherein the alignment assisting insulation layer is thinner than the die.

3. The die package as set forth in claim 1, wherein a metal auxiliary layer is formed on the lower surface of the die to facilitate the formation of the solder layer.

4. The die package as set forth in claim 1, further comprising:
   an external connection terminal formed on the second end of the redistribution layer which is exposed outside through the opening of the solder resist layer.

5. A die package, comprising:
   a support plate having a die attachment area thereon, with an alignment guide metal layer formed on the die attachment area of the support plate;
   a die having a solder layer formed on a lower surface thereof, and a pad formed on an upper surface thereof, the die being mounted to the die attachment area of the support plate through the solder layer;
   a metal post formed on the pad of the die;
   an encapsulation layer formed on the support plate and the die such that an upper surface of the metal post is exposed outside the encapsulation layer;
   a redistribution layer connected at a first end thereof to the metal post, the redistribution layer extending a predetermined length on the encapsulation layer; and
   a solder resist layer formed on the encapsulation layer, the solder resist layer having an opening such that the second end of the redistribution layer is exposed outside through the opening of the solder resist layer.

6. The die package as set forth in claim 5, wherein a metal auxiliary layer is formed on the lower surface of the die to facilitate the formation of the solder layer.

7. The die package as set forth in claim 5, further comprising:
   an external connection terminal formed on the second end of the redistribution layer which is exposed outside through the opening of the solder resist layer.

8. A method of manufacturing a die package, comprising:
   forming an alignment assisting insulation layer on an upper surface of a support plate made of metal, the support plate having a die attachment area on an upper surface thereof, the alignment assisting insulation layer being open on the die attachment area of the support plate;

mounting a die having a solder layer on a lower surface thereof to the die attachment area of the support plate using surface tension between the solder layer and the support plate;

forming a metal post connected to a pad provided on an upper surface of the die, and forming an encapsulation layer such that an upper surface of the metal post is exposed outside the encapsulation layer;

forming a redistribution layer extending a predetermined length on the encapsulation layer such that a first end of the redistribution layer is connected to the metal post; and forming a solder resist layer on the encapsulation layer and the redistribution layer, the solder resist layer having an opening such that the second end of the redistribution layer is exposed outside through the opening of the solder resist layer.

9. The method as set forth in claim 8, wherein at the forming of the alignment assisting insulation layer, the alignment assisting insulation layer is formed thinner than the die.

10. The method as set forth in claim 8, wherein a metal auxiliary layer is formed on the lower surface of the die to facilitate the formation of the solder layer.

11. The method as set forth in claim 8, wherein the mounting of the die comprises:

disposing the die having the solder layer on the lower surface thereof around the die attachment area of the support plate using a pickup head; and automatically aligning the die with the die attachment area using surface tension between the solder layer and the support plate in such a way as to apply heat to the solder layer.

12. The method as set forth in claim 8, further comprising: after the forming of the solder resist layer, forming an external connection terminal on the second end of the redistribution layer which is exposed outside through the opening of the solder resist layer; and singulating a package set including a plurality of die packages into individual die packages along scribing lines, thus producing the die package.

13. A method of manufacturing a die package, comprising:

forming an alignment guide metal layer on a die attachment area of a support plate;

mounting a die having a solder layer on a lower surface thereof to the die attachment area of the support plate using surface tension between the solder layer and the alignment guide metal layer;

forming a metal post connected to a pad provided on an upper surface of the die, and forming an encapsulation layer such that an upper surface of the metal post is exposed outside the encapsulation layer;

forming a redistribution layer extending a predetermined length on the encapsulation layer such that a first end of the redistribution layer is connected to the metal post; and forming a solder resist layer on the encapsulation layer and the redistribution layer, the solder resist layer having an opening such that the second end of the redistribution layer is exposed outside through the opening of the solder resist layer.

14. The method as set forth in claim 13, wherein a metal auxiliary layer is formed on the lower surface of the die to facilitate the formation of the solder layer.

15. The method as set forth in claim 13, wherein the mounting of the die comprises:

disposing the die having the solder layer on the lower surface thereof around the die attachment area of the support plate using a pickup head; and automatically aligning the die with the die attachment area using surface tension between the solder layer and the alignment guide metal layer in such a way as to apply heat to the solder layer.

16. The method as set forth in claim 13, further comprising: after the forming of the solder resist layer, forming an external connection terminal on the second end of the redistribution layer which is exposed outside through the opening of the solder resist layer; and singulating a package set including a plurality of die packages into individual die packages along scribing lines, thus producing the die package.

* * * * *